(12) United States Patent
Lendi et al.

(10) Patent No.: US 7,071,691 B2
(45) Date of Patent: Jul. 4, 2006

(54) DIGITAL FILTER FOR NMR AN MRI APPLICATIONS

(75) Inventors: Pietro Lendi, Uznach (CH); Werner Tschopp, Forch (CH)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 11/077,570

(22) Filed: Mar. 11, 2005

(65) Prior Publication Data

US 2005/0225324 A1 Oct. 13, 2005

(30) Foreign Application Priority Data

Apr. 10, 2004 (DE) .................. 10 2004 017 667

(51) Int. Cl.
*G01V 3/00* (2006.01)
(52) U.S. Cl. ...................... 324/309; 324/318
(58) Field of Classification Search .............. 324/309, 324/307, 318, 319, 322, 300; 600/410
See application file for complete search history.

(56) References Cited

U.S. PATENT DOCUMENTS

| 4,992,736 | A | * | 2/1991 | Stormont et al. ........... 324/309 |
| 5,170,123 | A | * | 12/1992 | Holland et al. ............. 324/322 |
| 5,560,361 | A | * | 10/1996 | Glusick ....................... 600/410 |
| 5,652,518 | A | * | 7/1997 | Wurl ........................... 324/322 |
| 2003/0062901 | A1 | | 4/2003 | Shang |

FOREIGN PATENT DOCUMENTS

EP 0 412 747 2/1991

OTHER PUBLICATIONS

Holland C. N. "Whole Body Magnetic Resonance Spectrometers: All-Digital Transmit/Receive Systems" Encyclopedia of Nuclear Magnetic Resonance, vol. 8, 1996, pp. 5010-5014.

Deilef Moskau "Application of Real Time Digital Filters in NMR Spectroscopy", Concepts in Magnetic Resonance Engineering, vol. 15(2), 154-176 (2002).

\* cited by examiner

*Primary Examiner*—Brij B. Shrivastav
(74) *Attorney, Agent, or Firm*—Paul Vincent

(57) ABSTRACT

A method for operating a magnetic resonance spectrometer with a digital filter whose input is fed with an NMR signal of a time length $T_A$, and whose output signal consists of a rising oscillation $B_1$ of a length $T_B$, a signal portion [F]' which consists of a filtered FID or echo signal of the length $T_A$ and a decaying oscillation $B_2$ of a length $T_B$, wherein this output signal is initially modified using a calculation process RV, and is subsequently transformed by Fourier transformation to a desired NMR spectrum, is characterized in that, during the calculation process RV, only the signal portion [F]' is initially selected, at least N copies of the rising oscillation $B_1$ are subsequently generated in positive time shifts $T_A$ with respect to each other and are positioned on the signal portion [F'] in time such that the end of the first rising oscillation is positioned at the end of the signal portion, at least N copies of the decaying oscillation $B_2$ are generated in negative shifts $T_A$ and are positioned on the signal portion [F'] in time such that the start of the first decaying oscillation is positioned at the start of the signal portion [F'], and all N copies of the rising oscillation $B_1$ defined in this manner and N copies of the decaying oscillation $B_2$ defined in this manner are added to the signal portion [F'], and only the range $T_A$ thereof which contains the signal portion [F'] is selected as resulting signal F''' of the calculation process RV, wherein the number N is to be calculated using the formula $N=T_B/T_A$ and rounded to the next higher integer number. This exactly compensates for the influence of the group delay time of digital, linear-phased filters in a mathematically exact manner.

5 Claims, 9 Drawing Sheets $T_A < T_B$

Prior Art

Region 1

Region 2

Region 3

Region 4

Phase characteristic compensated to zero

Region 5

DIGITAL FILTER FOR NMR AN MRI APPLICATIONS

This application claims Paris Convention priority of DE 10 2004 017 667.1 filed Apr. 10, 2004 the complete disclosure of which is hereby incorporated by reference.

BACKGROUND OF THE INVENTION

Digital filters have been used for a relatively long time for receiver systems in modern NMR and MRI spectrometers. They are generally designed as low-pass filters, and are applied together with the over-sampling and decimation methods. Since the receiver system usually contains a quadrature detector, two digital filters are required for each receiver system.

FIG. 6 shows the last function blocks of a modern NMR receiver system with two quadrature channels A and B including the two digital filters 3a and 3b, and also the two digitizers 2a and 2b for digitizing the two analog NMR signals of the channels A and B.

The sampling rate of the digitizers is normally chosen as large as possible to be more flexible in the design of the analog anti-aliasing filters and to profit from the resolution gain of the over-sampling method. Since, however, the digital filter delimits the frequency bandwidth of the filtered NMR signal and thereby also reduces the maximum frequency which can occur in the filtered NMR signal, much more data is produced than is required by the Nyquist theorem. For this reason, the data rate is additionally reduced after the digital filter (decimation method).

Analog low-pass filters, so-called anti-aliasing filters, are disposed before the two digitizers, whose cut-off frequency must be lower than half the over-sampling rate in order to satisfy the Nyquist criterion. The output signals of the two digital filters are fed into a computer where they are subjected to a calculation process RV and transformed into the desired NMR spectrum or MRI image through subsequent Fourier transformation.

NMR and MRI without digital filters is essentially unfeasible today, since the digital filters have the following important advantages:
1. They have a pass band with a very flat amplitude characteristic which practically does not falsify the signal amplitudes. This is of particular importance for the integration of the NMR signals.
2. The transition band which defines the transition from the pass band to the stop band, may be very narrow, such that a clearly defined region of the NMR spectrum can be cut out.
3. NMR signals within the stop band can be highly suppressed, even if they are very close to the transition region, and can therefore not be folded back into the desired pass band in subsequent decimation.

Two basic types of digital filters have established themselves among those which are in use, namely the "Infinite Impulse Response" Filter (=IIR filter) and the "Finite Impulse Response" Filter (=FIR filter). NMR and MRI almost exclusively use the exact linear-phased FIR filter, since it produces no phase-related distortions and has a finite pulse response function thereby delimiting the filtered NMR signal in time.

The most important disadvantage of the application of linear-phased FIR filters in NMR and MRI is the shape of the NMR signal in the time domain at the output of the filter. This reflects the influence of the large group delay time $T_B$ which is typical for linear-phased and steep digital filters, such that the FID signal appears only after a long and slowly rising oscillation of length $T_B$. This requires very large linear phase correction in the NMR spectrum. Moreover, a long and slowly decaying oscillation, also of length $T_B$, is present at the end of the FID signal.

There are additional further features:
- more data points are generated at the filter output than are entered at the input. This feature can be compensated for through suitable measures.
- when window functions and/or "backward linear prediction" methods (BLP) are used, the influence of the group delay time must be considered.
- the influence of the group delay time must also be taken into consideration for compensating a possible DC portion in the filtered NMR signal.

FIG. 5, region 2 shows the NMR signal F' at the output of a linear-phased FIR filter. It is composed of the rising oscillation $B_1$ of a length $T_B$, the actual NMR signal [F]' of a length $T_A$, and of the decaying oscillation $B_2$ of length $T_B$. The rising and decaying oscillations are composed not only of the portions $B_1$ or $B_2$ but also have portions [$B_1$] or [$B_2$] which are both within [F]'. It should also be noted that the detection time $T_{ERF}$ of the NMR signal after the FIR filter is larger that that before the FIR filter, namely $(T_B+T_A+T_B)$ compared to $T_A$.

To simplify representation of the filtered NMR signal including the rising and decaying oscillations, a simplified symbolic illustration in accordance with region 3 of FIG. 5 shall be used below instead of the precise illustration with plotted rising and decaying oscillations in accordance with region 2 of FIG. 5.

As will be apparent below, it is advisable to select the group delay time $T_B$ of the digital filter such that exact separation of the three signal regions $B_1$, [F]' and $B_2$ is possible. This is obtained by selecting the group delay time $T_B$ as an integer multiple of the period time of the decimated sampling rate. This condition is not absolutely necessary but considerably facilitates signal processing.

In NMR and also in MRI, the final aim is not the NMR signal (=time signal) but the NMR spectrum or the MRI image. Both require that the NMR signal be Fourier transformed, i.e. be transformed from the time to the frequency domain. To prevent falsification or additional distortions in the NMR spectrum with this transformation, the NMR spectra of the filtered and non-filtered NMR signals should coincide to an optimum extent except for the filter function. This goal is obtained by initially carrying out a special calculation process RV on the filtered NMR signal before it is Fourier transformed.

The calculation process RV reduces the detection time $(T_B+T_A+T_B)$ of the filtered NMR signal F' down to the detection time $T_A$ of the NMR signal F at the filter input. Thereby the calculation process has to prevent the generation of any additional distortions in the frequency spectrum as far as possible. In this manner, the condition can be met that the NMR spectra of the filtered and non-filtered NMR signals maximally correspond to each other except for the filter function.

The correctness of the above-mentioned procedure is obvious by considering that the Fourier transformation implicitly and automatically periodizes the NMR signal to be transformed, and therefore the detecting times of the two NMR signals at the input and output of the filter must have the same value to obtain identical periodic times.

This specification refers exclusively to this calculation process RV, as is described in more detail below, first in connection with prior art and subsequently with the inventive method.

In a first step of the conventional calculation process RV which is usually used today for high-resolution NMR spectroscopy ($T_B<<T_A$), the filtered NMR signal is multiplied with a window function W1(t) (see FIG. 7, region 3) which is especially provided for this calculation process, wherein an NMR signal of length $T_A$ remains (see FIG. 7, region 4). This is achieved by selecting W1(t) such that a region of $2T_B$ at the end of the signal is multiplied by zero and can therefore be cut off. In this manner, an NMR signal of a length $T_A$ remains, as desired.

If only the Portion $B_2$ without the portion $[B_2]$ of the decaying oscillations is cut-off, this would lead to distortions in the NMR spectrum. To prevent this from happening, both portions $B_2$ as well as $[B_2]$ within the NMR signal [F]' have to be cut off. Elimination of all decaying oscillations in the end region of the NMR signal F', and not only of parts thereof, eliminates any distorting influence thereof on the NMR spectrum. The fact that signal portions are cut off with this method results in the loss of some information which is very small for high-resolution NMR spectroscopy, since usually $T_B<<T_A$.

The cut-off process itself can produce abrupt signal decay at the end of the filtered NMR signal, so that base line distortions in the NMR spectrum are produced if no countermeasures are taken. To prevent this, the filtered NMR signal must subsequently be multiplied with a suitable window function W1(t) thereby smoothing the abrupt decay.

This application of window functions is generally common in NMR, in particular, if there is not sufficient time to permit complete decay of the NMR signal (steady state experiments, multi-dimensional experiments) and if there is still sufficient signal-to-noise ratio and resolution.

In a last step, the steep phase characteristic caused by the digital filter is compensated for using a large linear phase correction, which can be obtained either through corresponding phase correction in the frequency domain or through cyclic rotation of the NMR signal in the time domain. In the second case, the rising oscillation $B_1$" is shifted to the end of F" (see FIG. 7, region 5).

The digital NMR signal F' at the output of the digital filter usually contains undesired disturbing components which are caused by the quality of the receiver electronics used. A disturbing DC component may e.g. exist which must in any event be eliminated before application of the window function W1(t) and Fourier transformation, since additional disturbing components could otherwise be generated in the NMR spectrum.

The illustrations of FIG. 8 show an NMR signal with an exaggerated high DC component $S_{DC}$. Region 1 shows the DC portion before filtering and region 2 after filtering, both drawings not showing the existing rising and decaying oscillations. Region 3 shows only the DC component itself without the FID, in the present case, however, with the existing rising and decaying oscillations. After cutting a length $2T_B$ off the end of the function F', a DC component is produced which consists of a step like transition function of a height $S_{DC}$ which is delayed by $T_B$, with rising and decaying oscillations at the transition point (see FIG. 8, region 4).

The value $S_{DC}$ can be easily determined from the function F' by selecting the end region of the function F' and determining therefrom the value $S_{DC}$ through forming an average value of the function. Since $S_{DC}$ is now known, the pure step function without rising and decaying oscillations can be uniquely defined. This function, however, is not appropriate for compensating the DC component of F' since the rising and decaying oscillations of F' would still remain uncompensated and cause distortions in the NMR spectrum.

The rising and decaying oscillations for a pure step function of a height $S_{DC}$ can be determined through calculation, since all parameters of the digital filter are known. Adding the calculated rising and decaying oscillations to the pure step function produces the desired function for complete compensation of the DC portion of F'.

In imaging MRI ($T_B \approx T_A$ and $T_B>T_A$), the situation can be completely different. Depending on the selected characteristic of the digital filter, the group delay time $T_B$ can become approximately equal or larger than $T_A$, such that the calculation process RV described in connection with high-resolution NMR spectroscopy would completely fail in this case. Since MRI usually works with echo signals (see FIG. 9 region 1), which start with a small value, reach a maximum value and subsequently drop again to finally once more assume a low value, a simple solution is still possible.

Region 2 of FIG. 9 shows the echo signal at the output of the digital filter. Obviously this signal meets the condition $T_B>T_A$. The rising and decaying oscillations $B_1$ and $B_2$ are usually negligibly small and can therefore be set to zero using the window function W1(t) (see FIG. 9, region 3) and be cut off. Also in this case, an echo signal of a length $T_A$ is obtained (see FIG. 9, region 4).

Cutting off the very weak rising and decaying oscillations nevertheless represents a small loss in information which may still noticeably deteriorate the quality of the MRI images.

The echo signal may also have a DC portion which can be compensated for as in high-resolution NMR spectroscopy.

If other MRI measuring methods are used for MRI which utilize e.g. semi-echo signals or FID signals, it must be ensured that $T_B<<T_A$ which is only possible if the group delay time of the digital filter is correspondingly small. If this is the case, the already described method for high-resolution NMR spectroscopy can be used.

The calculation process RV is composed of the following three steps which must be carried out in sequence and in the stated order:

1. Compensation of the DC portion in the filtered NMR signal F'
2. Multiplication with a suitable window function W1(t)
3. Compensation of the phase characteristic to zero by placing the rising oscillation $B_1$ at the end of the NMR signal (this step is not important in MRI since the rising oscillation has been cut off).

This calculation process RV has the following disadvantages:

1. The group delay time of the digital filter cannot be freely selected but must be adjusted to the existing NMR or echo signal. This is especially the case for MRI.
2. For compensation of the DC portion, the rising and decaying oscillations must be calculated using the filter parameters with the consequence that the producers of NMR spectrometers must pass on the filter parameters of their FIR filters to foreign application software providers. Secret know how could thereby reach the competitors.
3. The calculation process RV can be carried out only using window functions.

4. In high-resolution NMR spectroscopy, part of the FID signal must be cut off thereby losing part of the information.
5. MRI usually requires working with echo signals. Although this is almost general practice anyway, it still limits the possibilities.
6. In MRI, the rising and decaying oscillations $B_1$ and $B_2$ must be cut off. These are generally very small compared to the echo signal itself. Information is nevertheless lost thereby possibly deteriorating the sharpness of the sectional images.

SUMMARY OF THE INVENTION

It is the purpose of the inventive method to define a new calculation process RV which compensates for the influence of the group delay time of digital, linear-phased filters in a mathematically exact manner. The NMR signal F' (see e.g. FIG. 1) of length $T_A+2 T_B$ at the output of the digital filter should thereby result in an NMR signal F'' of length $T_A$ which no longer exhibits the disadvantages and delimitations of current prior art. In particular, parts of the filtered NMR signal must not be cut off and rising and decaying oscillations must be taken into consideration.

The central idea for deriving the new calculation process RV consists in thorough and mathematically exact consideration of the implicitly existing property of the Fourier transformation, namely the automatic periodizising of the NMR signal to be transformed.

This is achieved by viewing the function F of length $T_A$ at the input of the digital filter not by itself but as an infinitely long periodic function with the periodic time $T_A$. The individual signal portions within the periodic sections $T_A$ are all equal to the function F.

The infinite chain of signal portions F which we shall call F1 is imaginarily guided through the digital filter. Since the digital filter is a linear, time-invariant system (LTI system) the superposition principle can be applied, i.e. the individual signal portions F of F1 may be separated and individually guided through the digital filter and afterwards added again as individual filtered signal portions F'. This produces a new periodic signal which we shall call F2 and which also has a periodic time $T_A$. The individual signal portions of F2 shall be termed F'''. It should be noted that the Fourier transformation of F''' must necessarily be identical with the Fourier transformation of F except for the influence of the filter function. This means, however, that the NMR spectrum of the two functions F and F''' must also be identical except for the filter function. These results correspond exactly to the desired aim.

The above process can also be described as follows: The filtered NMR signal F' is imaginarily copied infinitely and the individual copies are positioned at separations of $T_A$ before and after the signal F' thereby unavoidably producing overlaps, since the signal F' and its copies are longer than $T_A$, due to their rising and decaying oscillations. Addition of these copies to the signal F' produces the above-described periodic signal F2 which is composed of signal portions F''' only.

The periodization can be conceptually left out, since the subsequent Fourier transformation will reintroduce it automatically. It is therefore sufficient to observe the individual signals F and F''', both of length $T_A$, by themselves and since the signal F''' does not have an explicit group delay time $T_B$, it does not have a steep phase characteristic but instead a zero phase characteristic as desired.

The signal F''' may, of course, additionally be multiplied with a window function W2(t) which may be reasonable if the original NMR signal F abruptly decays at the end of the NMR signal, as described above, which is necessarily also transferred to F'''. Such decays generally produce distortions of the NMR lines and to keep these as small as possible, F''' is initially multiplied by a window function which has a monotonic decay to zero in the end region, before being Fourier transformed.

The above considerations concerning the calculation process RV are based on infinitely long periodic functions. Since, however, the filtered NMR signal F' is limited in terms of time due to the finite pulse response function of the FIR filter, it is sufficient to consider only a finite number (1+2 N) of copies of the functions F' for calculating the function F'''.

DESCRIPTION OF THE PREFERRED EMBODIMENT

Figure 1:
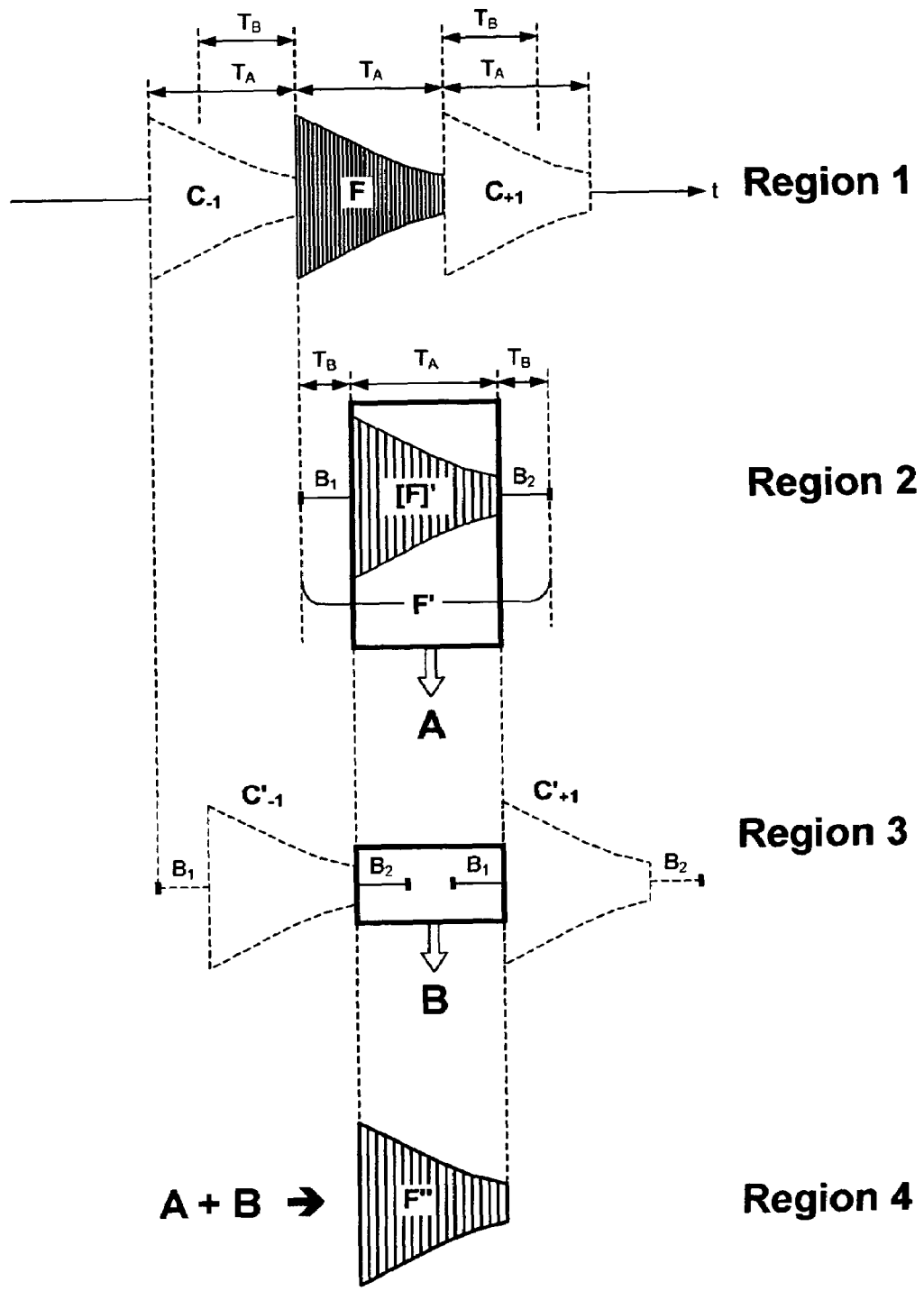
FIG. 1 inventive calculation process RV, shown for the case that the group delay time $T_B$ is smaller or equal to the acquisition time $T_A$. This includes e.g. high-resolution NMR spectroscopy. The resulting signal F''' contains the two rising and decaying oscillations $B_1$ and $B_2$ respectively.

FIG. 1 shows the case of $T_A \geq T_B$ and one can see that three sequential signals F', namely $C'_{-1}$, F' and $C'_{+1}$ are completely sufficient to define F''' (see regions 2 and 3). $C'_{-1}$ and $C'_{+1}$ are copies of F' and are each displaced about $T_A$ in a positive and negative direction with respect to F'. Further copies of F' are not required since they are sufficiently far away from F' that their rising or decaying oscillations can no longer overlap the signal F'. In this case N=1.

FIG. 1 shows initial selection of the NMR signal [F]' only and its storage as value A (region 2). The decaying oscillation $B_2$ of $C'_{-1}$ and the rising oscillation $B_1$ of $C'_{+1}$ are subsequently selected and stored as value B (region 3). A and B are finally added which produces the desired signal F''' of length $T_A$ (region 4).

Figure 3:
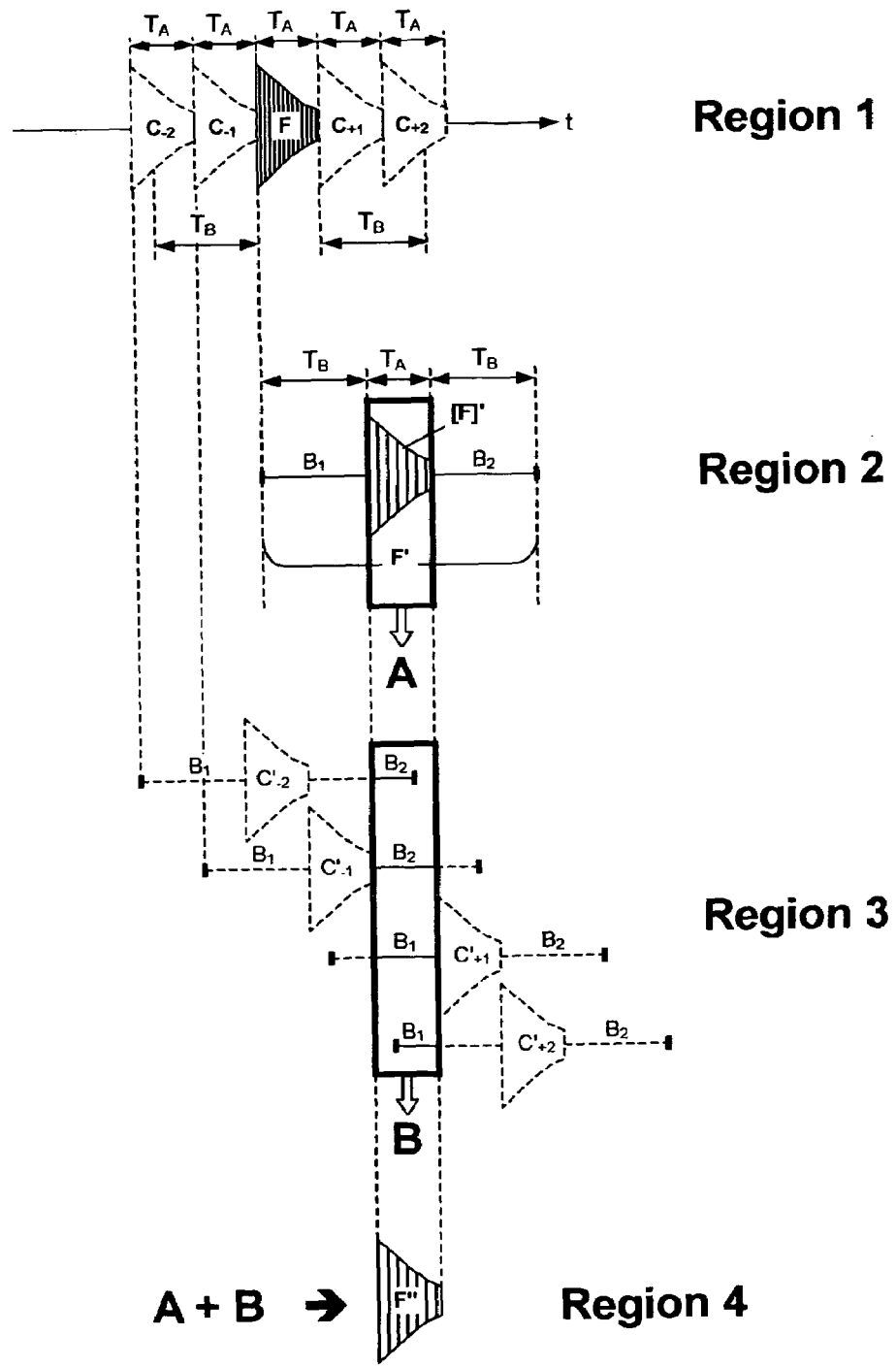
FIG. 3 inventive calculation process RV, shown for the case that the group delay time $T_B$ is larger than the acquisition time $T_A$. This includes e.g. also MRI. The resulting signal F''' contains a plurality of superimposed rising and decaying oscillations $B_1$ and $B_2$ respectively.

If $T_A < T_B$ more than three successive signals F' must be taken into consideration. FIG. 3 shows a corresponding example, wherein $T_B$=1.33 $T_A$ and five successive signals F' are required to define F''', namely $C'_{-2}$, $C'_{-1}$, F', $C'_{+1}$ and $C'_{+2}$. The calculation process RV proceeds analogously to FIG. 1, with the difference that for calculation of the value B only portions of the rising and decaying oscillations must be added. In this case, N=2. In the general case, the minimum number of successive signals F', which must be taken into consideration, must be 1+2 N, wherein N is determined by the quotient value ($T_B/T_A$) which must be subsequently rounded to the next higher integer number.

The DC portion which is usually present in the calculated NMR signal F''' must initially be compensated for before carrying out further calculative manipulations on F'''. The DC portion, however, consists in this case only of a constant value $S_{DC}$ without rising or decaying oscillations, and for this reason, it is sufficient to determine this value by calculating an average value of the end region of F''' and subtracting it from the signal F'''. In contrast to prior art, the filter parameters need not be known for this compensation and for this reason, the producer of NMR spectrometers is not forced to pass on these filter parameters to foreign application software providers.

Figure 2:
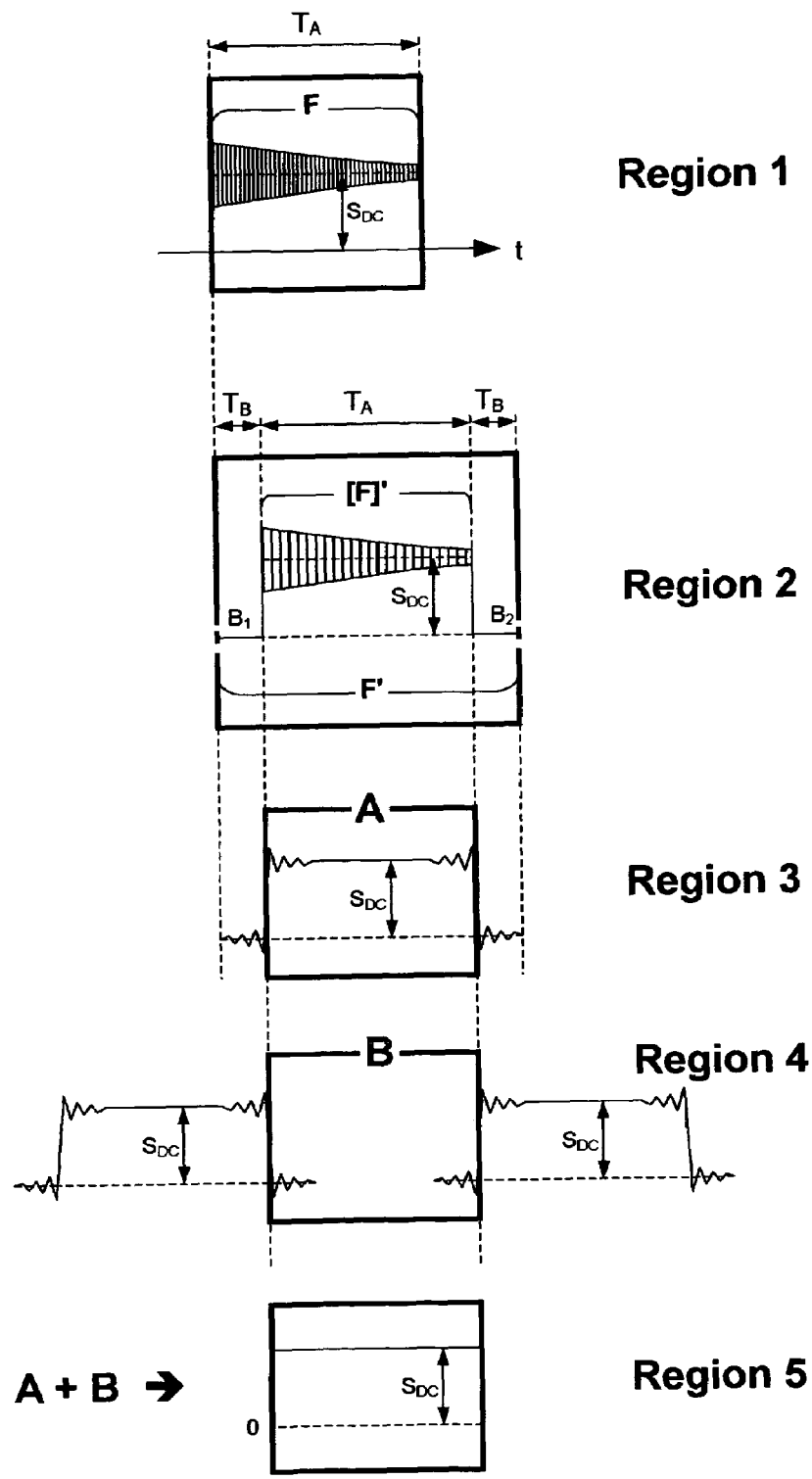
FIG. 2 determination of the DC portion of the signal F''' in accordance with the inventive method. The resulting DC component consists only of a constant value $S_{DC}$ without any rising or decaying oscillation.

FIG. 2 shows how the DC portion of the signal F''' is generated. FIG. 2, region 2 shows the filtered NMR signal with the DC component $S_{DC}$. Region 3 shows the entire time dependence of the DC component of the signal F' without the FID. It still has rising and decaying oscillations. After positioning the two copies of the DC component on the left-hand and right-hand sides of the original DC component (see region 4) and adding all three-step functions, a DC portion without rising and decaying oscillations is generated (see region 5). The rising and decaying oscillations have compensated each other so that the DC component of the signal F''' consists only of a constant value $S_{DC}$.

After the DC portion of the signal F''' is removed, F''' can be multiplied with a window function $W_2(t)$, if desired by the applicant.

It is also allowed to add zero values to the end of the signal F''' (the technical term is "zero filling") in order to artificially improve the resolution of the NMR spectrum.

The calculation process RV has the following advantages:
1. There is no limitation in the selection of the group delay time of the digital filter, which is the case, in particular, for MRI.
2. The calculation process RV basically requires no special window functions W1(t). The rising and decaying oscillations caused by the FIR filter are completely present in the resulting signal F'''.
3. No portions of the NMR signal must be cut off and therefore no information is lost.
4. The signal F''' resulting from the calculation process RV has the same length $T_A$ as the signal F at the input of the FIR filter and also automatically has a zero phase characteristic. The result is the same as if a linear-phased zero phase filter had been used.
5. The DC portion of the signal F''' consists only of a constant value $S_{DC}$ without rising or decaying oscillations. For this reason, compensation of the DC portion is quite simple in that only a constant DC value must be subtracted from the signal F'''. For this reason, no information about the filter parameters must be passed on to external application software providers.
6. MRI no longer depends on primary use of echo signals, i.e. normal FID signals can also be processed without producing distortions in the MRI image.

Figure 4:
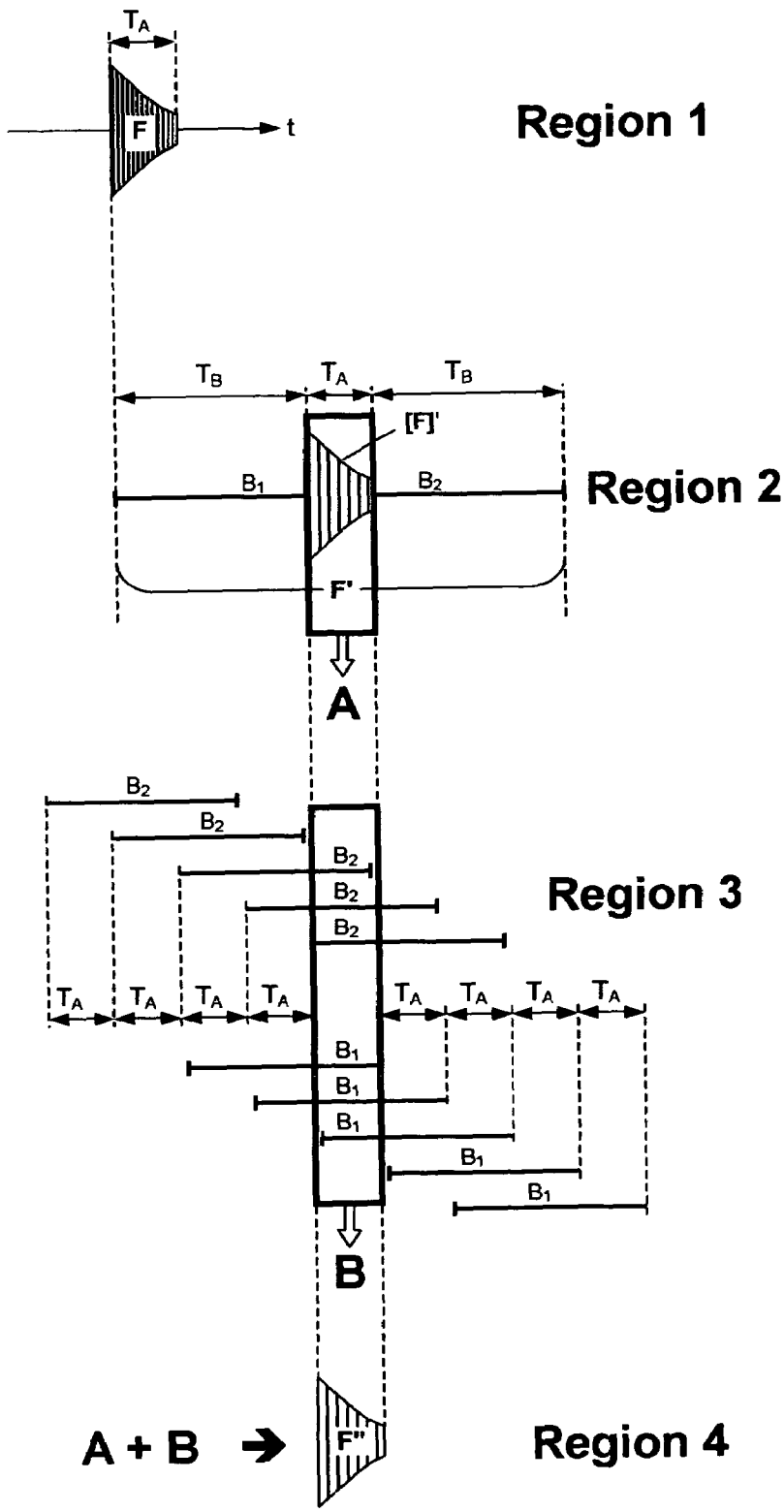
FIG. 4 inventive calculation process RV for the general case. The resulting signal F''' contains a plurality of superimposed rising and decaying oscillations $B_1$ and $B_2$ respectively.
Figure 5:
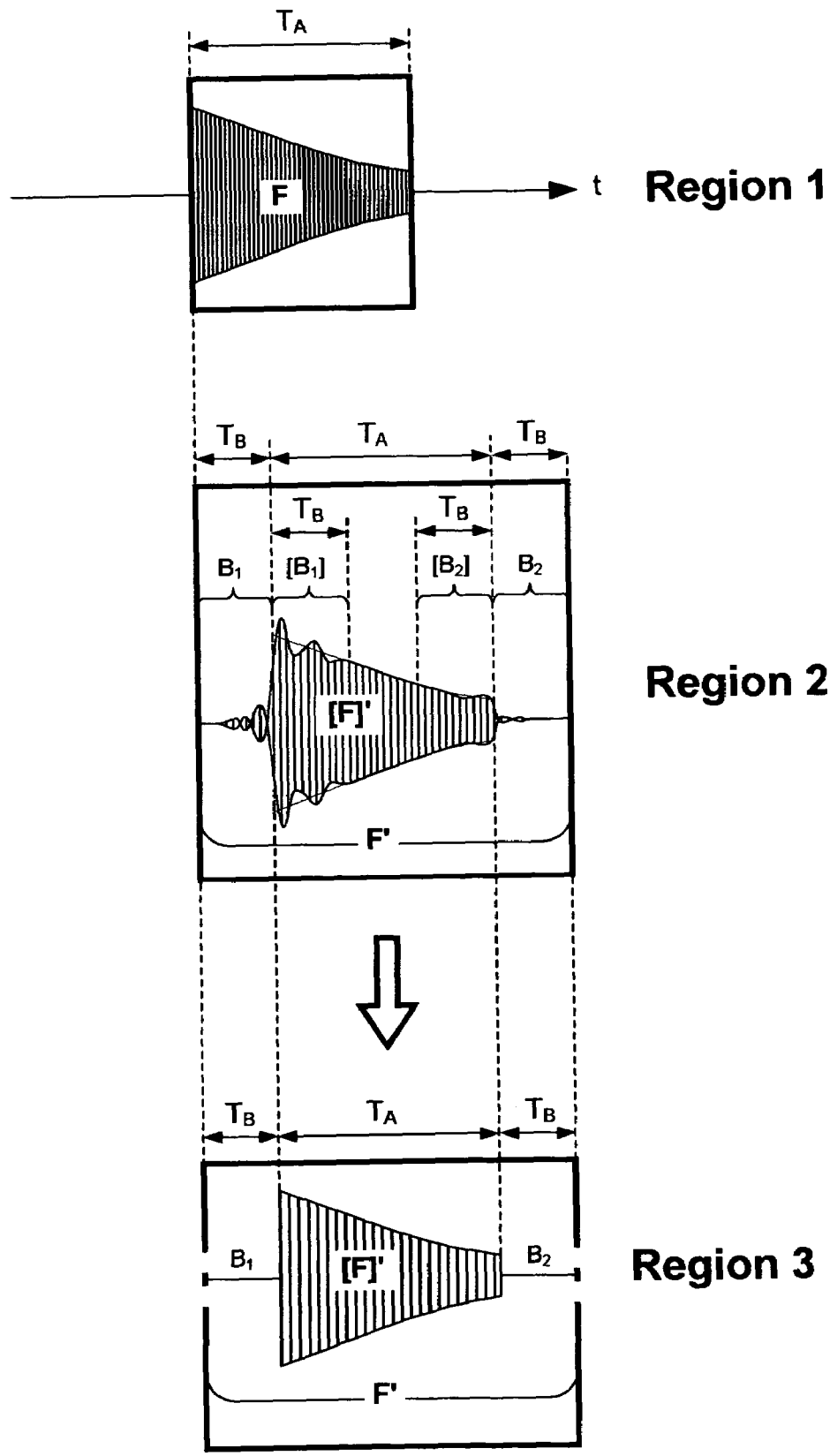
FIG. 5 detailed illustration of the filtered NMR signal F' (see region 2) and a simplified symbolic representation of the same NMR signal F' (see region 3).
Figure 6:
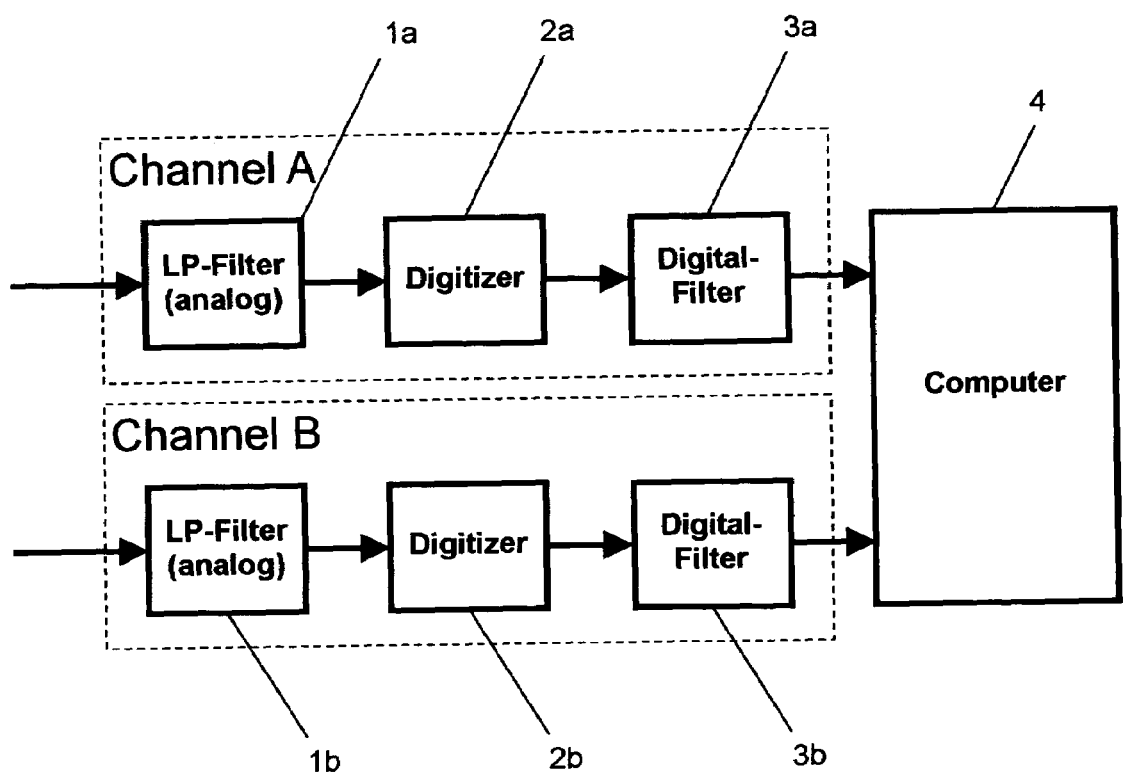
FIG. 6 structure of the low frequency part of an NMR or MRI receiving system, showing a system which typically works with a quadrature detection and therefore contains two channels A and B.
Figure 7:
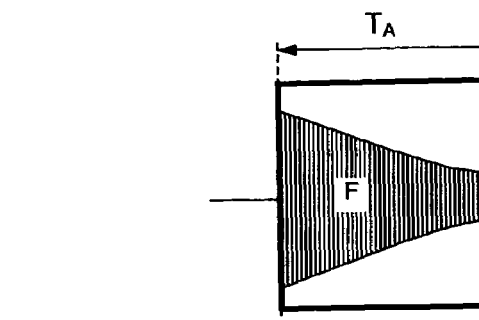
FIG. 7 calculation process RV for high-resolution NMR spectroscopy in accordance with prior art. The desired length $T_A$ of the resulting NMR signal could be obtained only through cutting away signal portions and using a window function $W_1(t)$.
Figure 7:
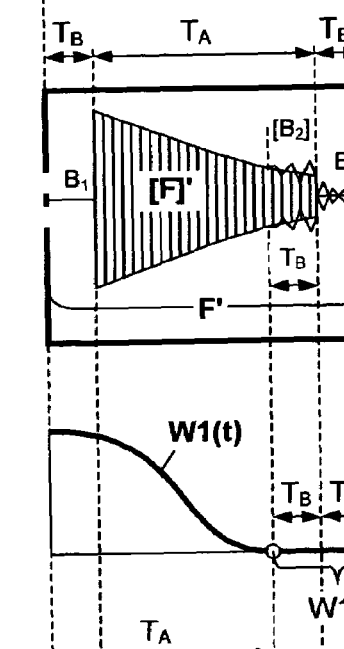
Figure 7:
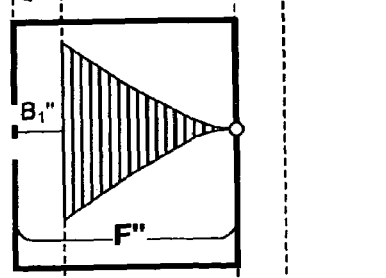
Figure 7:
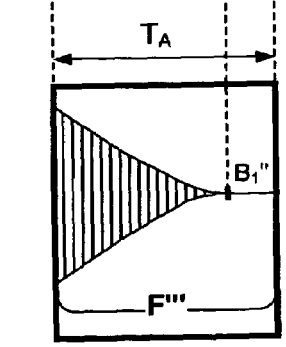
Figure 8:
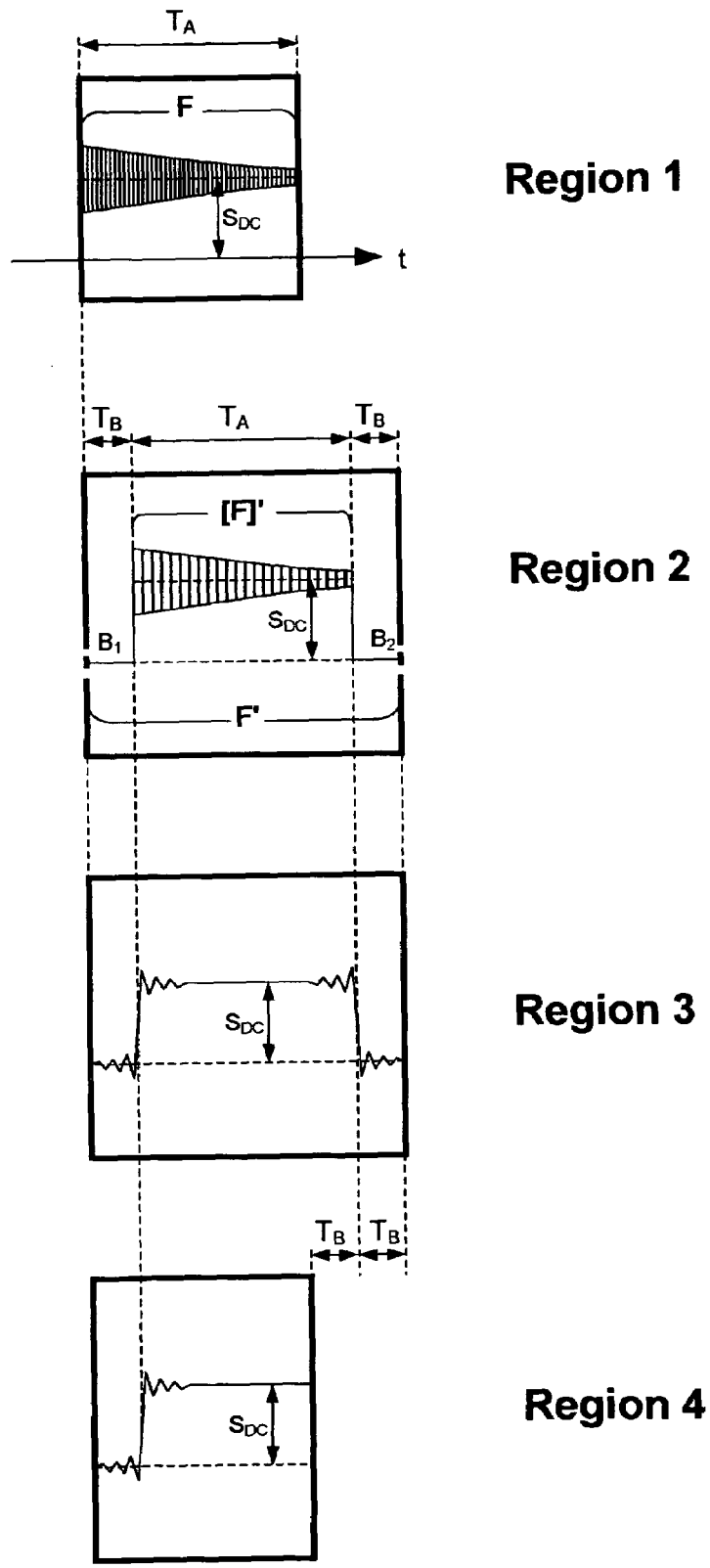
FIG. 8 DC component of the function F''' in accordance with prior art. It consists of a unity step function which is scaled with the value $S_{DC}$ and has rising oscillations at its transition point. Compensation of this DC component including its rising oscillation requires that the filter parameters be known.
Figure 9:
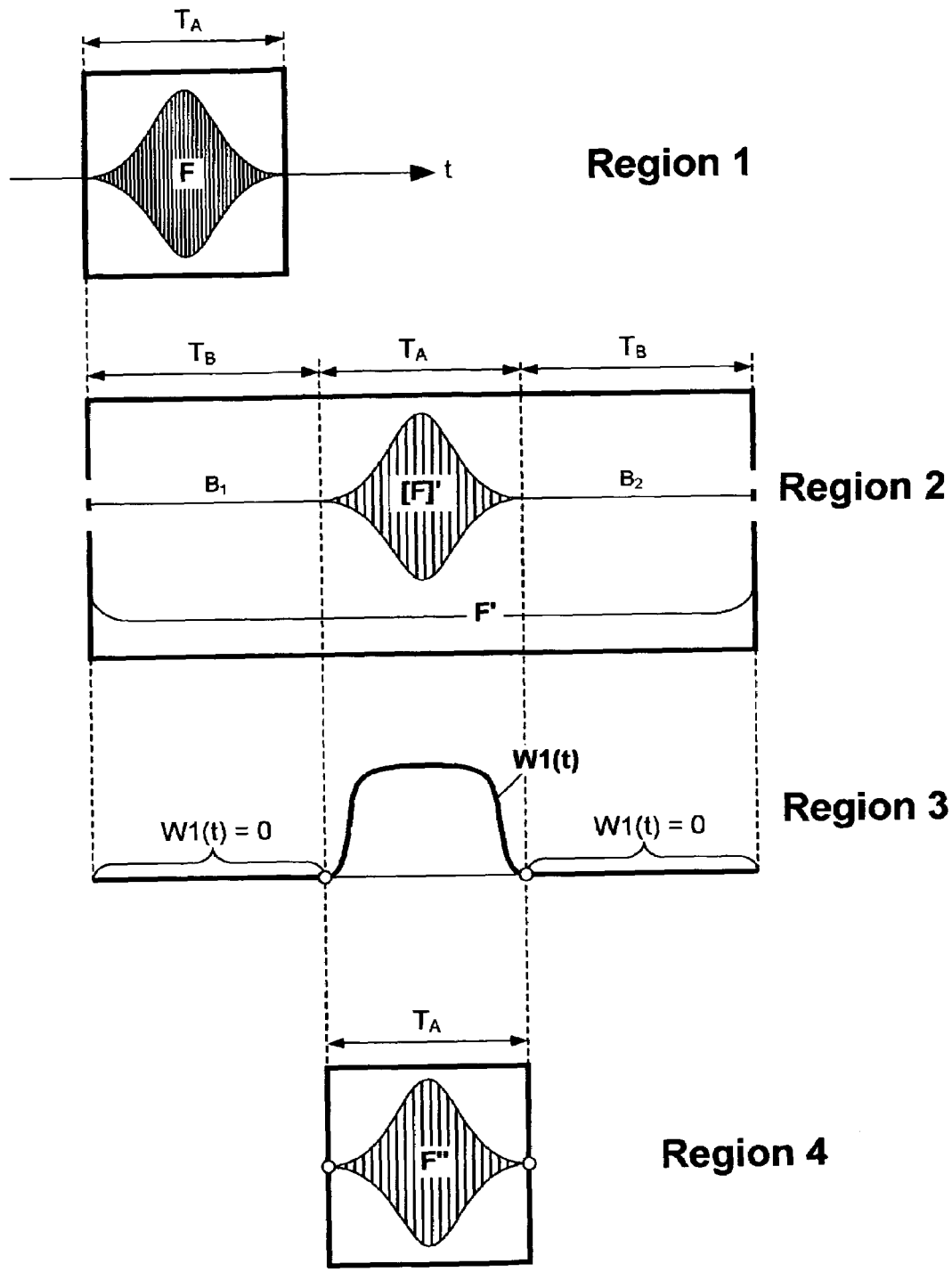
FIG. 9 calculation process RV for imaging MRI in accordance with prior art. The desired length $T_A$ of the resulting echo signal is obtained by cutting away the signal portions $B_1$ and $B_2$. The latter are generally negligibly small but without them the quality of the MRI images may, in certain cases, still noticeably deteriorate.

From the above-mentioned explanations, a formula may be derived for the calculation process RV which is valid for all cases described by the inventive method. It consists of the following steps:
1. Select the signal portion [F]' of length $T_A$ (=A in FIG. 4, region 2) from the digitally filtered NMR signal F'.
2. Generate at least N copies of the rising oscillation $B_1$ in positive time shifts $T_A$ with respect to each other and position them on the signal portion [F]' such that the end of the first rising oscillation is positioned at the end of [F]' (see FIG. 4, region 3).
3. Generate at least N copies of the decaying oscillation $B_2$ in negative time shifts $T_A$ and position them on the signal portion [F]' such that the start of the first decaying oscillation is positioned at the start of [F]' (see FIG. 4, region 3).
4. Add all N above mentioned copies of the rising oscillation and all N above mentioned copies of the decaying oscillation (=B in FIG. 4, region 3) to the signal portion [F]' and select therefrom only portion $T_A$ which contains the signal portion [F]'. The result is the desired NMR signal F''' (see FIG. 4, region 4) which automatically has a zero phase characteristic.
5. Compensate for the DC component $S_{DC}$ in the NMR signal F'''. This is achieved by simple subtraction of a constant value $S_{DC}$ (see FIG. 2, region 5) of the NMR signal F'''. Rising and decaying oscillation of the DC portion do not exist and must therefore not be taken into consideration!
6. At this point, multiplication with a window function W2(t) or "zero filling" may be performed, if desired.
7. Fourier transform the resulting NMR signal.

To obtain the number N, an intermediate value is initially calculated using the formula $N=T_B/T_A$. Subsequently the resulting value is rounded to the next higher integer number.

The first four steps of the above-mentioned calculation process RV may be described in the following manner as well:

During the calculation process RV, initially only the signal portion [F]' is selected, subsequently at least N copies of the rising oscillation $B_1$ are generated in positive time separations $T_A$ relative to each other and are positioned on the signal portion [F]' in time such that the end of the first rising oscillation is positioned at the end of the signal portion [F]', and at least N copies of the decaying oscillation $B_2$ are generated in negative time shifts $T_A$ relative to each other and are positioned on the signal portion [F]' in time such that the start of the first decaying oscillation is positioned at the start of the signal portion [F]' and that, finally, all N copies of the rising oscillation $B_1$ defined in this manner and N copies of the decaying oscillation $B_2$ defined in this manner are added to the signal portion [F]' and only portion $T_A$ thereof, which contains the signal portion [F]' is selected as resulting signal F''' of the calculation process RV, wherein the number N is to be calculated using the formula $N=T_B/T_A$ and rounded to the next higher integer number.

The following terms used in the specification and claims are defined as follows:

| | |
|---|---|
| MRI | "Magnetic Resonance Imaging" Imaging NMR method having switched magnetic gradient fields. |
| Pass band | frequency range which is completely transmitted by the digital filter. |
| Transition band | region within the frequency characteristic of the digital filter which represents the transition from the pass band to the stop band. The frequency components in this region are thereby neither completely suppressed nor completely transferred. |
| Stop band | frequency range which is suppressed by the digital filter. |
| Anti-aliasing | analog low-pass filter which is placed before the digitizer and is responsible for satisfying the Nyquist criterion. |
| Decimation | reduction of the sampling rate which may be carried out after limiting the frequency bandwidth of the NMR signal. |
| Calculation process RV | calculative transformation of the original filtered NMR signal to a new filtered NMR signal with length $T_A$. |
| Channel A | first channel of quadrature detection. |
| Channel B | second channel of quadrature detection. |
| FID | "Free Induction Decay". Typical NMR signal with generally exponential decay which can be generated e.g. by a 90° excitation pulse. |
| Echo | typical NMR signal with generally exponential rise and subsequent exponential decay which can be generated e.g. by a 90°, followed by a 180° excitation pulse. |
| DC component | (DC = direct current) undesired DC-component in the NMR signal, generally a residual signal which is generated by the electronics and is superimposed on the FID or echo signal. |
| $S_{DC}$ | value of the DC component. |
| W1(t) | window function with which the filtered NMR signal had to be modified in accordance with prior art. |
| W2(t) | window function with which the NMR signal is multiplied before Fourier transformation to improve the quality of the NMR spectrum (e.g. reduction of the truncation effect). |
| Truncation effect | line distortions in the NMR spectrum which can be generated e.g. by NMR signals which have not decayed completely. |
| F | NMR signal at the input of the digital filter. |
| F' | NMR signal at the output of the digital filter. |
| [F]' | component of the NMR signal F' at the output of the digital filter which is directly related to the NMR signal F at the input of the digital filter. |
| F" | NMR signal after finishing calculation process RV and without explicit compensation of the phase characteristic. |
| F'" | MRI signal after finishing calculation process RV and including an explicit compensation of the phase characteristic. |
| $T_{erf}$ | detection time of the complete NMR signal after digital filtering. |
| $T_A$ | length of the NMR signal F (=acquisition time). |
| $T_B$ | group delay time of the digital filter. The rising and decaying oscillations $B_1$ and $B_2$ in the filtered NMR signal both have the length $T_B$. |
| $B_1$ | region before the function [F]' which contains a rising oscillation. |
| $B_2$ | region after the function [F]' which contains a decaying oscillation. |
| $[B_1]$ | initial region within the signal [F]' which contains a rising oscillation. |
| $[B_2]$ | end region within the signal [F]' which contains a decaying oscillation. |
| N | number of copies of F' which must be positioned before and after the signal F' to calculate therefrom the signal F" in accordance with the inventive method. |

The following reference symbols of the figures are defined as follows:

1a, 1b analog low-pass filters, so-called anti-aliasing filters which are responsible for satisfying the Nyquist criterion.
2a, 2b digitizers for digitizing the two analog NMR signals of the quadrature detector.
3a, 3b digital filters to delimit the frequency range of the NMR signal and subsequently introduce decimation.
4 computer which performs the calculation process RV and Fourier transformation.

We claim:

1. A method for operating a nuclear magnetic resonance (NMR) or a magnetic resonance imaging (MRI) spectrometer using a digital filter which is installed in a low-frequency region of a receiver system, the digital filter having an input which is fed with an NMR signal of time length $T_A$ and with an output signal consisting essentially of a rising oscillation $B_1$ of time length $T_B$, a signal portion [F]', which consists of a filtered FID or echo signal of time length $T_A$, and a decaying oscillation $B_2$ of time length $T_B$, wherein this output signal is initially modified using a calculation process RV and subsequently transformed into a desired NMR spectrum through Fourier transformation, the method comprising the steps of:

a) initially selecting, during the calculation process RV only the signal portion [F]';

b) subsequently generating at least N copies of the rising oscillation $B_1$ in positive time shifts $T_A$ relative to each other;

c) positioning the at least N copies of the rising oscillation $B_1$ on the signal portion [F]' in time such that an end of a first rising oscillation is positioned at an end of the signal portion [F]';

d) generating at least N copies of the decaying oscillation $B_2$ in negative time shifts $T_A$ relative to each other;

e) positioning the at least N copies of the decaying oscillation $B_2$ on the signal portion [F]' in time such that a start of a first decaying oscillation is positioned at a start of the signal portion [F]';

f) adding all N copies of the rising oscillation $B_1$, defined in this manner, and all N copies of the decaying oscillation $B_2$, defined in this manner, to the signal portion [F]'; and g) selecting, following step f), only portion $T_A$ which contains the signal portion [F]'' as a resulting signal F'' of the calculation process RV, wherein the number N is calculated using the formula $N=T_B/T_A$ and rounded to a next higher integer number.

2. The method of claim 1, wherein a DC component in the resulting signal F'' is compensated for through simple subtraction of a constant value $S_{DC}$ to produce a desired DC-compensated signal F''', wherein the value $S_{DC}$ is determined by forming an average value of an end region of the resulting signal F''.

3. The method of claim 2, wherein the DC-compensated signal F''' is multiplied with a window function W2(t) before being subsequently Fourier transformed.

4. The method of claim 2, wherein, at an end of the DC-compensated signal F''', only zero values are added (=zero filling) and a signal produced thereby is subsequently Fourier transformed.

5. A nuclear magnetic resonance (NMR) spectrometer or magnetic resonance imaging (MRI) spectrometer having a digital filter which is installed in a low frequency region of a receiver system, the spectrometer structured and dimensioned to perform the method of claim 1.

* * * * *